US008514618B2

(12) United States Patent
Lombard et al.

(10) Patent No.: US 8,514,618 B2
(45) Date of Patent: Aug. 20, 2013

(54) MAGNETIC RANDOM ACCESS MEMORY CELL WITH IMPROVED DISPERSION OF THE SWITCHING FIELD

(75) Inventors: Lucien Lombard, Grenoble (FR); Ioan Lucian Prejbeanu, Seyssinet Pariset (FR)

(73) Assignee: Crocus-Technology SA, Grenoble (FR)

( * ) Notice: Subject to any disclaimer, the term of this patent is extended or adjusted under 35 U.S.C. 154(b) by 0 days.

(21) Appl. No.: 13/545,303

(22) Filed: Jul. 10, 2012

(65) Prior Publication Data

US 2013/0016551 A1    Jan. 17, 2013

(30) Foreign Application Priority Data

Jul. 12, 2011   (EP) ...................................... 11290321

(51) Int. Cl.
*G11C 11/00*   (2006.01)

(52) U.S. Cl.
USPC ........... 365/158; 365/148; 365/171; 977/933; 977/935

(58) Field of Classification Search
USPC ................. 365/48, 55, 62, 66, 74, 78, 80–93, 365/100, 130, 131, 148, 158, 171–173, 209, 365/213, 225.5, 230.07, 232, 243.5; 216/22; 257/421, E21.665; 438/3; 428/810–816, 428/817–825.1, 826; 977/933–935
See application file for complete search history.

(56) References Cited

U.S. PATENT DOCUMENTS

| 6,798,691 | B1 * | 9/2004 | Ounadjela et al. ............ 365/171 |
| 6,950,335 | B2 | 9/2005 | Dieny et al. |
| 7,173,791 | B2 * | 2/2007 | Ikarashi ........................ 360/110 |
| 7,230,845 | B1 * | 6/2007 | Wang et al. .................... 365/173 |
| 7,518,835 | B2 * | 4/2009 | Huai et al. ................. 360/324.12 |
| 2003/0107849 | A1 * | 6/2003 | Ikarashi ..................... 360/324.1 |
| 2004/0246777 | A1 * | 12/2004 | Maejima et al. .............. 365/173 |
| 2005/0094470 | A1 * | 5/2005 | Ikarashi ........................ 365/222 |
| 2006/0083057 | A1 * | 4/2006 | Nakayama et al. ........... 365/171 |
| 2006/0146602 | A1 | 7/2006 | Lin et al. |
| 2007/0002504 | A1 * | 1/2007 | Huai et al. ................ 360/324.12 |
| 2007/0019337 | A1 * | 1/2007 | Apalkov et al. ............ 360/324.1 |
| 2007/0070689 | A1 * | 3/2007 | Ikegawa et al. ............... 365/171 |
| 2007/0297219 | A1 | 12/2007 | Dittrich et al. |
| 2009/0073748 | A1 | 3/2009 | Klostermann |

* cited by examiner

*Primary Examiner* — Harry W Byrne
(74) *Attorney, Agent, or Firm* — Pearne & Gordon LLP

(57) ABSTRACT

The present disclosure concerns a magnetic random access memory MRAM cell comprising a tunnel magnetic junction formed from a first ferromagnetic layer, a second ferromagnetic layer having a second magnetization that can be oriented relative to an anisotropy axis of the second ferromagnetic layer at a predetermined high temperature threshold, and a tunnel barrier; a first current line extending along a first direction and in communication with the magnetic tunnel junction; the first current line being configured to provide an magnetic field for orienting the second magnetization when carrying a field current; wherein the MRAM cell is configured with respect to the first current line such that when providing the magnetic field, at least a component of the magnetic field is substantially perpendicular to said anisotropy axis. The MRAM cell has an improved switching efficiency, lower power consumption and improved dispersion of the switching field compared to conventional MRAM cells.

12 Claims, 4 Drawing Sheets

(a)   (b)   (c)   (d)

MAGNETIC RANDOM ACCESS MEMORY CELL WITH IMPROVED DISPERSION OF THE SWITCHING FIELD

FIELD

The present invention concerns a magnetic random access memory (MRAM) cell comprising a tunnel magnetic junction and having improved switching efficiency, lower power consumption and improved dispersion of the switching field compared to conventional MRAM cells. The present disclosure also concerns a MRAM device comprising a plurality of MRAM cells and a method for writing the MRAM cells.

DESCRIPTION OF RELATED ART

Memory devices that employ variable resistance materials include resistive random access memories (RRAM), phase change random access memories (PRAM), ferroelectric random access memories (FRAM), magnetic random access memories (MRAM), etc. The non volatile memory devices listed above may store data based on a variation in the resistance of a variable resistance material (RRAM), a phase change material having amorphous and crystalline states (PRAM), a ferroelectric material having different polarization states (FRAM), and/or a magnetic tunnel junction film of a ferroelectric material having different magnetized states (MRAM).

Devices based on MRAM have experienced a renewed interest since magnetic tunnel junctions demonstrated a strong magnetoresistance at ambient temperature. MRAM present many advantages such as high writing and reading speeds (down to a few nanoseconds) non volatility, and insensitivity to ionizing radiations. The development of MRAM cells with a magnetic tunnel junction has allowed a significant increase in the performances and operating mode of MRAMs.

In the simplest implementation, magnetic random access memory (MRAM) cells comprise at least a magnetic tunnel junction formed of two magnetic layers separated by a thin insulating layer, where one of the layer, the so-called reference layer, is characterized by a fixed magnetization and the second layer, the so-called storage layer, is characterized by a magnetization which direction can be changed upon writing of the memory. When the respective magnetizations of the reference layers and the storage layer are antiparallel, the resistance of the magnetic tunnel junction is high (Rmax), corresponding to a logic state "1". On the other hand, when the respective magnetizations are parallel, the resistance of the magnetic tunnel junction becomes low (Rmin), corresponding to a logic state "0". The logic state of the MRAM cell is read by comparing its resistance state to a reference resistance Rref, preferably derived from a reference cell or an array of reference cells, with a reference resistance of typically Rref=(Rmin+Rmax)/2, combined in-between the magnetic tunnel junction resistance of the logic state "1" and the resistance of the logic state "0".

In conventional practical implementations, the reference layer is "exchange biased" to an adjacent antiferromagnetic reference layer characterized by a critical temperature (above which the exchange bias vanishes) known as the blocking temperature TBR of the antiferromagnetic reference layer.

In an implementation of the MRAM cell using a thermally assisted switching (TAS) procedure, for example as described in U.S. Pat. No. 6,950,335, the storage layer is also exchange biased to an adjacent antiferromagnetic storage layer which blocking temperature $T_{BS}$ (the temperature at which the exchange bias of the antiferromagnetic storage layer vanishes) is lower than that the blocking temperature $T_{BR}$ of the antiferromagnetic reference layer pinning the reference layer. Below the blocking temperature $T_{BS}$, the storage layer is difficult and/or impossible to write. Writing is then performed by heating the magnetic tunnel junction above $T_{BS}$ but below $T_{BR}$, preferably but not limited to by sending a heating current through the magnetic tunnel junction, in order to free the magnetization of the storage layer, while simultaneously applying a magnetic field, the so-called writing field, generated by a field current. The magnetic tunnel junction is then cooled down below the blocking temperature $T_{BS}$, where the storage layer magnetization is "frozen" in the written direction.

The free layer can be fabricated to have a preferred axis for the direction of magnetization called the "easy axis" (EA), and is typically set along the direction of the reference magnetization, by intrinsic anisotropy and/or shape anisotropy of the MTJ.

During the write procedure, the reversal mechanism of the storage layer magnetization by the magnetic field can occur through a rotation of the magnetization (clockwise or counter-clockwise) or through the formation of various non uniform magnetization configuration such as magnetic domain walls, vortex configurations, C-shaped or S-shaped magnetization configuration. The magnetic field magnitude required to switch the magnetization direction of the storage layer strongly vary depending of which magnetization configuration is involved during magnetization switching, thus leading to both high values and an important variability of the reversal magnetic field.

In the case of a magnetic memory device formed by assembling an array comprising a plurality of memory TAS-MRAM cells, the properties of the individual cells across the array such as their shape may vary due to fabrication process fluctuations. This can result in a variation of shape anisotropy from within the cell array, adding to the write field variability.

SUMMARY

The present application discloses a magnetic random access memory cell with thermally assisted switching procedure and a method for writing the memory device which overcome at least some limitation of the prior art.

According to the embodiments, a MRAM cell can comprise: a tunnel magnetic junction formed from a reference layer, a storage layer and an insulating layer being disposed between the storage and the reference layer; wherein said storage layer has a storage magnetization that can be oriented relative to a storage anisotropy axis of the storage layer over a predetermined high temperature threshold; a current line electrically connected to the magnetic tunnel junction; a field line in communication with the magnetic tunnel junction, the field line being configured to provide a magnetic field for orienting the storage magnetization when carrying a field current; the MRAM cell being configured with respect to the field line such that when providing the magnetic field, at least a component of the magnetic field is substantially perpendicular to said storage layer anisotropy axis; wherein the second ferromagnetic layer has an asymmetrical shape along at least one of its dimension such that the second magnetization comprises a C-state pattern, and wherein said C-state pattern being changeable into a S-state pattern by the second field component and the second magnetization being switchable by the first field component, when the magnetic field is provided.

In another embodiment, the magnetic tunnel junction can further comprise an antiferromagnetic storage layer adapted to pin the storage magnetization below a predetermined low temperature threshold.

In yet an embodiment, the MRAM cell can further comprise a selection transistor coupled with said magnetic tunnel junction and being selectable to heat said magnetic tunnel junction to a high temperature threshold during the write operation, by applying a heating current through said magnetic tunnel junction via the current line when the transistor is selected.

The present disclosure also concerns a MRAM device comprising a plurality of the MRAM cell, a plurality of the field lines connecting MRAM cells along a row; and a plurality of the current lines, connecting MRAM cells along a column.

The present disclosure also pertains to a method for writing the MRAM cell, comprising:

heating the magnetic tunnel junction;

once the magnetic tunnel junction has reached the predetermined high temperature threshold, switching the second magnetization of the second ferromagnetic layer;

cooling the magnetic tunnel junction at a predetermined low temperature threshold for freezing the second magnetization in its written state;

cooling the magnetic tunnel junction to a low temperature threshold to freeze the storage magnetization in its written state;

wherein said switching the storage magnetization can comprise passing the field current in the field line so as to apply the magnetic field such as to orient the storage magnetization and wherein at least a component of the magnetic field is substantially perpendicular to said storage anisotropy axis, and wherein said switching the second magnetization further comprises changing the C-state pattern of the second magnetization into a S-state pattern by the second field component.

In an embodiment, the magnetic field further can comprise a first field component that is oriented substantially parallel to the anisotropic axis, switching the second magnetization. Said passing the field current can be performed prior said cooling the magnetic tunnel junction.

In another embodiment, the method can further comprise turning off the field current and wherein said cooling the magnetic tunnel junction at a predetermined low temperature threshold is performed prior to turning off the field current.

The MRAM cell disclosed herein has an improved switching efficiency, lower power consumption and improved dispersion of the switching field compared to conventional MRAM cells.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
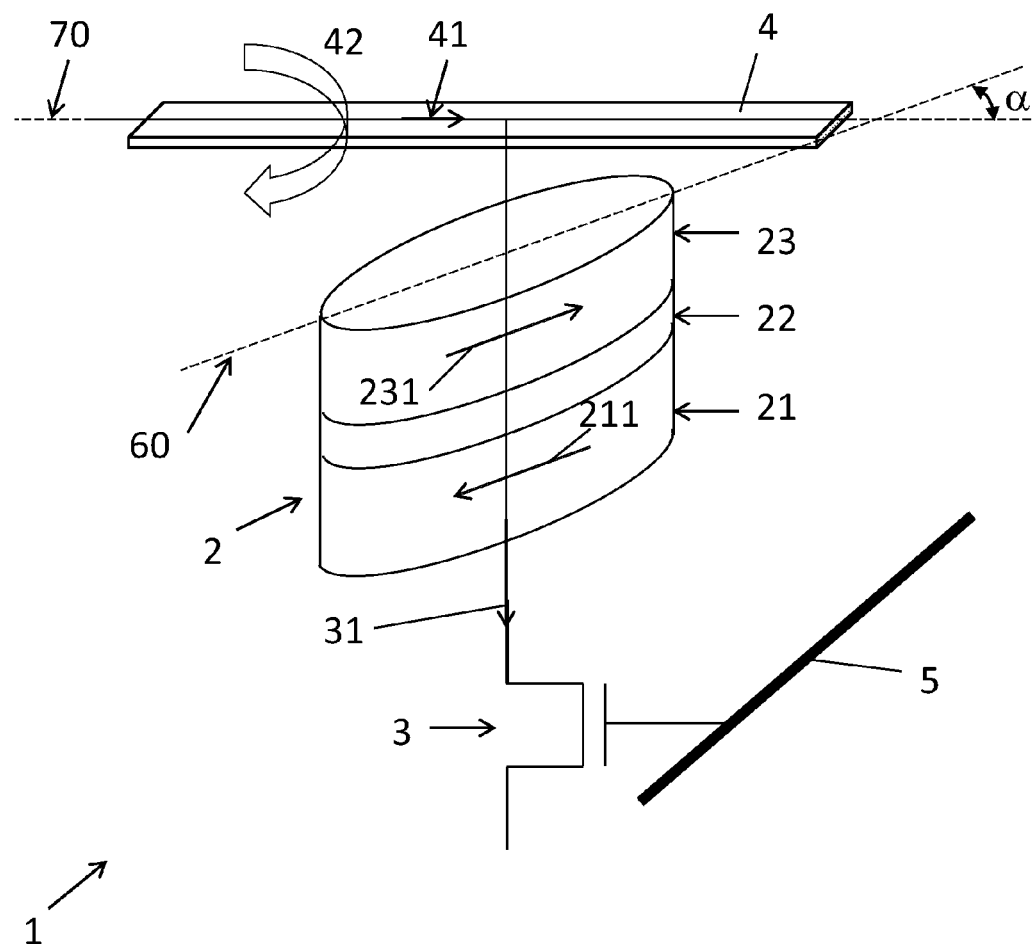
FIG. 1 represents a perspective view of a magnetic random access memory (MRAM) cell with thermally assisted switching procedure according to an embodiment.

FIG. 1 represents a perspective view of a magnetic random access memory MRAM cell 1 according to an embodiment. The MRAM cell 1 comprises a magnetic tunnel junction 2 comprising a reference layer 21 having a reference magnetization 211, a storage layer 23 having a storage magnetization 231 that can be freely aligned at a predetermined high temperature threshold, and a tunnel barrier 22 provided between the reference layer 21 and the storage layer 23. The MRAM cell 1 further comprises a field line 4 extending along a first direction 70. The field line 4 is configured to provide an external magnetic field 42 to the storage layer 23 for orienting the storage magnetization 231 when carrying a field current 41. The MRAM cell 1 can also comprise a select transistor 3 in electrical communication with the other end of the magnetic tunnel junction 2, the select transistor being controlled by a current line 5 being arranged substantially orthogonal with the first current line 4.

The storage layer 23 comprises an easy axis of magnetization, or storage anisotropy axis 60, and a hard axis of magnetization 61, both easy and hard axis 60 and 61 being oriented perpendicular to one another along a single plane in directions perpendicular to one another. The storage magnetization 231 tends to arrange itself along the anisotropy axis 60 without the influence of an external magnetic field. During a write operation of the MRAM cell 1, the storage magnetization 231 can be further oriented relative to the anisotropy axis 60 such as to store a logic state of a bit. For example, both logic 0 and logic 1 states may be defined by the direction of the storage magnetization 231 being typically oriented at 180° from each other during the write operation.

The magnetic tunnel junction 2 can further comprise a storage antiferromagnetic layer (not shown) exchange-coupling the storage magnetization 231 such that, over a predetermined high temperature threshold the storage magnetization 231 can be freely oriented and the storage layer 231 is pinned below a first predetermined low temperature threshold. The reference layer 21 can also be coupled by a reference antiferromagnetic layer (also not shown), pinning its magnetization below a second predetermined low temperature threshold being higher than the first predetermined high temperature threshold.

In an embodiment, the anisotropy axis 60 results inherently from the shape of the storage layer 23. This is also known as shape anisotropy. Here, the shape of the storage layer 23 induces the storage magnetization 231 to arrange itself along a dimension of the memory cell without the influence of the external magnetic field 42.

In the example of FIG. 1, the MRAM cell 1 has an elliptical shape and the anisotropy axis 60 is oriented along the long axis of the elliptically shaped storage layer 23. The MRAM cell 1 is configured such that the long axis, and thus the anisotropy axis 60, is oriented at the predetermined angle α with the current line 4 direction. In the absence of the applied magnetic field 41, the first magnetization 231 is substantially oriented along the long axis, or anisotropy axis 60, and thus, oriented at the predetermined angle α with the first current line 4.

The anisotropy axis 60 may also result from any other anisotropic shape of the MRAM cell 1, for example, where the storage layer 23 has an aspect ratio of its length/width greater than one. Possible anisotropic shapes may comprise, without being limited to, elliptical, diamond, and rectangular shapes, the anisotropy axis 60 corresponding to the long axis, or longest dimension, of the storage layer 23. Moreover, the anisotropic shape of the MRAM cell 1 is not necessarily limited to the sole storage layer 23 and one or more of the other MRAM cell layers can exhibit the anisotropic shape. In an embodiment, all layers of the MRAM cell 1 exhibit the anisotropic shape.

In another embodiment not represented, the anisotropy axis is determined by uniaxial crystal field anisotropy, also called magnetocrystalline anisotropy. The preferred magnetization direction due to magnetocrystalline anisotropy can be set, for example, during film deposition of the storage layer 23 by a bias field or by annealing the film after deposition in a high magnetic field (e.g. several kOe) at elevated temperatures (e.g. 200° C. to 300° C.). The magnetocrystalline anisotropy can also be combined with the shape anisotropy as described above, whereas the storage layer 23 and possibly any other layers of the MRAM cell 1 can an anisotropic shape in addition to the magnetocrystalline anisotropy.

In an embodiment, the write operation for writing data to the MRAM cell 1 comprises heating the magnetic tunnel junction 2; switching the storage magnetization 231 of the storage layer 23; and cooling the magnetic tunnel junction 2 below a low temperature threshold for freezing the storage magnetization 231 in its written state. Heating the magnetic tunnel junction 2 can comprise passing a heating current 31 via the current line 5 and through the magnetic tunnel junction 2 when the select transistor 3 is in a passing mode. Once the magnetic tunnel junction 2 has reached the predetermined high temperature threshold, switching the storage magnetization 231 can be performed by passing the field current 41 in the field line 4 for applying the magnetic field 42 adapted to orient the storage magnetization 231. Cooling the magnetic tunnel junction 2 can comprise turning off the heating current 31 by setting the select transistor 3 in a blocked mode. A read operation for reading the written state can comprise passing a read current (not represented) in the magnetic tunnel junction 2 via the current line 5 such as to measure a resistance of the magnetic tunnel junction 2. The resistance of the magnetic tunnel junction 2 is determined by the relative orientation of the storage magnetization 231 compared to the one of the reference magnetization 211. In an embodiment not represented, the first magnetization 211 orientation is fixed relative to the one of the second magnetization 231, for example, by being pinned by the antiferromagnetic reference layer as described above.

Figure 2:
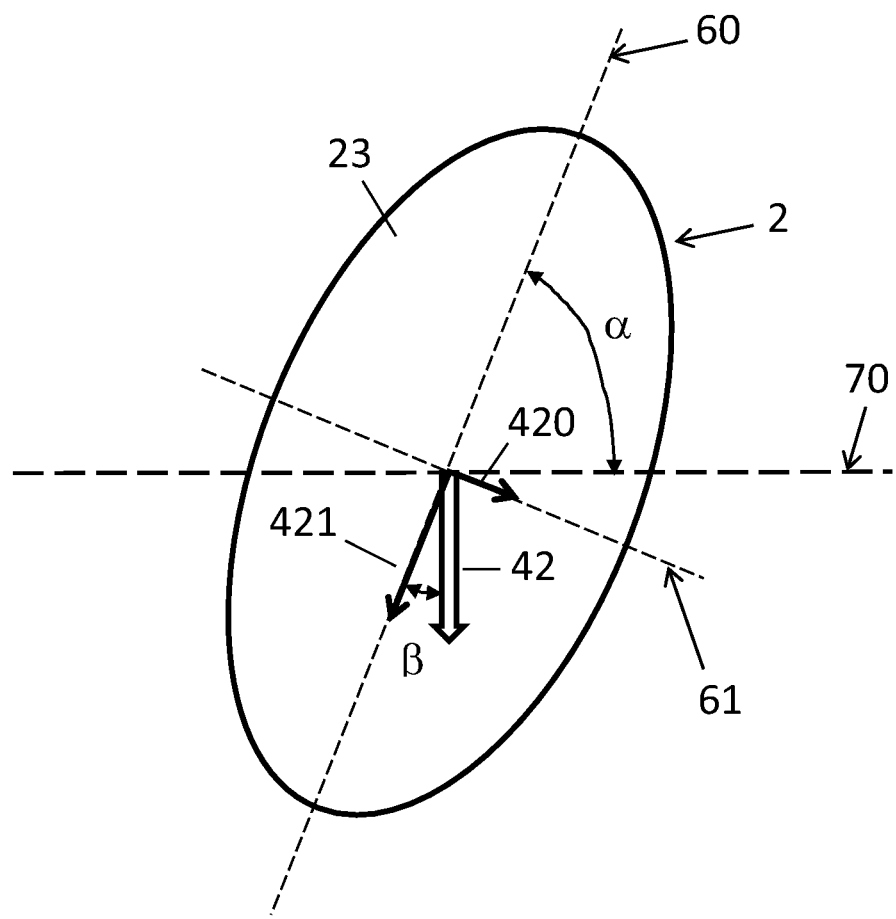
FIG. 2 represents a top view of the MRAM cell according to an embodiment.

The MRAM cell 1 is configured with respect to the field line 4 such that the anisotropy axis 60 is oriented at a predetermined angle $\alpha$ with the field line 4. In such a configuration, passing the field current in the field line 4 generates the applied magnetic field 42 with at least a component of the magnetic field 42 that is substantially perpendicular to the anisotropy axis 60 (or parallel to the hard axis of magnetization 61). In the example of FIG. 2 showing a top view of the MRAM cell 1, the applied magnetic field 42 comprises a first field component 421 that is oriented substantially parallel to the anisotropic axis 60, and a second field component 420 being oriented substantially perpendicular with the anisotropic axis 60.

In this configuration, the first field component 421 will be responsible for orienting the storage magnetization 231 in the direction of the first field component 421, or for the switching of the storage magnetization 231. The second field component 420, being substantially perpendicular with the anisotropy axis 60 and thus with the initial orientation of the storage magnetization 231, will induce the storage magnetization 231 to rotate in the direction of the second field component 420. The second field component 420 can then facilitate the switching of the storage magnetization 231. Since the relative magnitudes of the first and second field components 421, 420 depend on the predetermined angle $\alpha$, their respective influence on the second magnetization 231 can be varied by varying the predetermined angle $\alpha$ between the anisotropic axis 60 and the field line 4.

Preferably, the predetermined angle $\alpha$ should be chosen in a range such that $0°<\alpha<90°$ with $\alpha$ allowing for a minimum switching field, as described in Reference X: E. P. Stoner, E. C. & Wohlfarth "A Mechanism of Magnetic Hysteresis in Heterogeneous Alloys", Philosophical Transactions of the Royal Society of London. Series A, Mathematical and Physical Sciences 240(826), 599-642 (1948). Preferably the predetermined angle $\alpha$ should be chosen between 0° and 45°, and more preferably substantially 45°.

In an embodiment, during the write operation the field current 41 is turned off after the step of cooling the magnetic tunnel junction 2, once the magnetic tunnel junction 2 has reached the predetermined low temperature threshold. In this case, the storage magnetization 231 is frozen when being orientated by the applied magnetic field 42, more particularly, in a direction being substantially perpendicular to the field line 4. Consequently, the frozen storage magnetization 231, corresponding to the written state level, is oriented at a predetermined angle $\beta$ with the anisotropy axis 60.

In another embodiment, the field current 41 is turned off prior to the step of cooling the magnetic tunnel junction 2. In this case, applying the magnetic field 41 is ceased when the magnetic tunnel junction 2 is still at the predetermined high temperature threshold and the storage magnetization 231 becomes oriented along the anisotropy axis 60, in the switched direction. The magnetic tunnel junction 2 can then be cooled such as to freeze the second magnetization 231 in the switched direction by turning off the heating current 31.

The MRAM cell 1 disclosed herein allows for an improved switching efficiency due to the facilitating effect of second field component 420 during the switching of the storage magnetization 231. Smaller values of the magnetic field 42, and thus field current 41, can be used, resulting in lower power consumption of the MRAM cell 1. In contrast, conventional TAS-MRAM cells are typically configured such that the anisotropy axis is oriented parallel with the direction of the applied magnetic field 42. In such conventional configuration the switching of the magnetization is triggered by thermal activation, and the switching speed is limited by the stochastic nature of the thermal activation. Higher values of the applied magnetic field are thus required with conventional MRAM cells to achieve switching speed comparable to the ones achieved in the MRAM cell 1 of the invention. This in turn requires the use of larger underlying selection transistors sourcing the higher field currents, resulting in large and unpractical MRAM cell sizes. It also results in high power dissipation and to a potential wear and correlated lack of reliability of the magnetic tunnel junction, in particular of the tunnel barrier.

A disadvantage of symmetrically shaped MRAM cells, is that they tend to be sensitive to variations in size, shape and defects. As a result, one or more cells in an array of symmetrically shaped MRAM cells may induce different equilibrium vector states producing switching mechanisms that differ from cell to cell. For MRAM cells having small dimensions (typically smaller than 100 nm), no domain walls can be formed and the switching mechanism, or reversal mechanism, can follow a reversal of magnetization through coherent rotation of magnetization. As described above, the anisotropy axis 60 can result from the shape of the storage layer 23. For example, the elliptically shaped storage layer 23 can induce a magnetization vector field pattern at equilibrium (i.e., in the absence of applied magnetic field) resembling an S-shape. Such S-shaped pattern, or S-state, usually requires a relatively low external magnetic field to switch the magnetization of the storage layer 23. The elliptically shaped storage layer 23, however, may sometimes induce an equilibrium magnetization vector field pattern resembling a C-shape, which is relatively more stable than the S-state and may require a substantially larger external magnetic field to switch the magnetic state of the MRAM cell 1.

Figure 3:
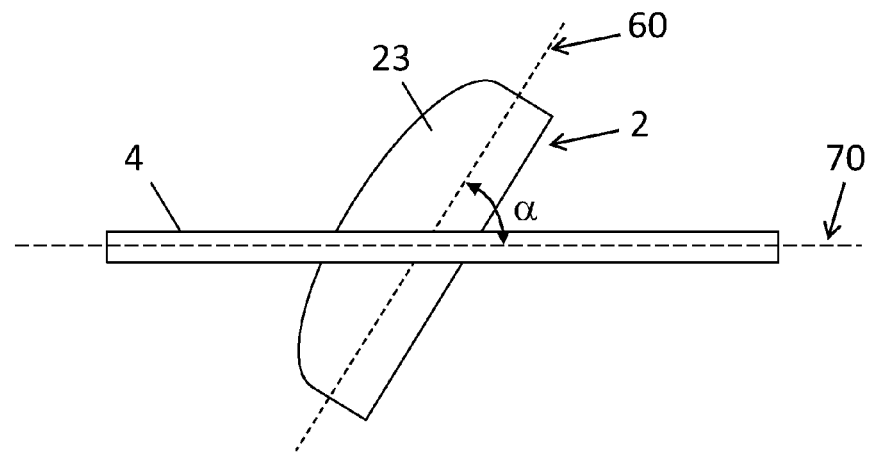
FIG. 3 illustrates the MRAM cell 1 according to another embodiment.

FIG. 3 illustrates a top view of the MRAM cell 1 according to another embodiment, where the storage layer 23 has an asymmetrical shape along at least one of its dimension. The asymmetrical configuration of the storage layer 23 is preferably arranged about the anisotropy axis 60. In the case the storage layer 23 has an aspect ratio greater than 1, the anisotropy axis 60 is typically arranged along its longest dimension. This allows the asymmetric shape to enforce the C-shape pattern of the magnetization at the expense of the S-shape pattern of the magnetization. In the example of FIG. 3, the asymmetric shape includes a single curved portion along one side of the perimeter and having a substantially straight perimeter on the opposing side. Alternatively, the asymmetric shape can comprise a curvature that is substantially concave on the opposing side. The substantially concave curvature can induce a stronger C-state compared to the straight perimeter. The MRAM cell 1 of FIG. 3 is also arranged such that the anisotropic axis 60 makes an angle α with field line 4.

The asymmetrical configuration of the storage layer 23 can also be arranged such that the storage layer 23 demonstrates an asymmetrical configuration when rotated about this second axis. The asymmetrical configuration of the storage layer 23 can be further arranged such that the storage layer 23 demonstrates an asymmetrical configuration when rotated about the anisotropy axis 60 and the second axis. The second axis can correspond to the hard axis of the storage layer 23. The storage layer 23 may include an asymmetrical perimeter having a larger curvature along one side of the perimeter than the opposing side of the perimeter. Such opposing sides of the perimeter may be about the anisotropy axis 60, and arranged along different portions of the perimeter depending on the shape of the storage layer 23. Moreover, the asymmetrical configuration is not necessarily limited to the sole storage layer 23 and one or more of the other MRAM cell layers can exhibit the substantially asymmetrical configuration. In an embodiment, all layers of the MRAM cell 1 exhibit the substantially asymmetrical configuration. The asymmetrical configuration of the storage layer 23 or of the one or more other MRAM cell layers can have an aspect ratio that can take any value approximately greater than or equal to 1.0.

Figure 4:
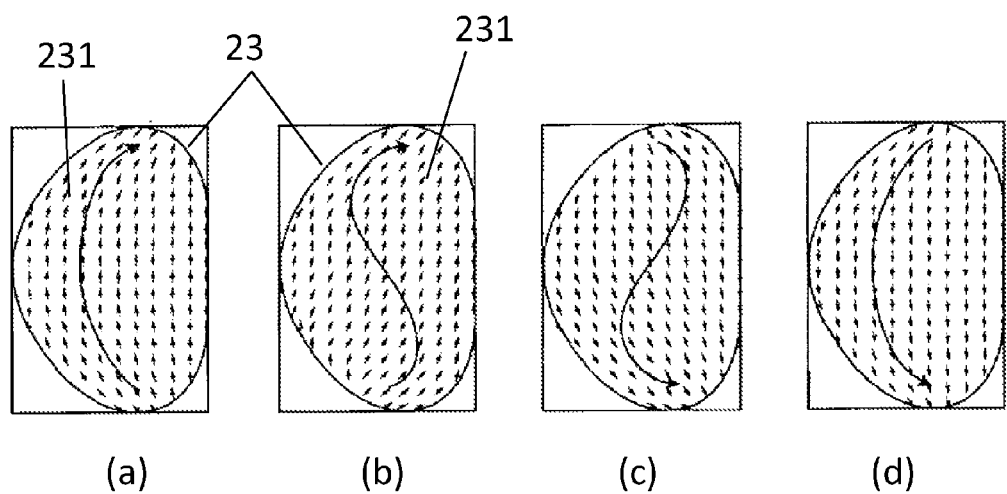
FIGS. 4a to 4d illustrate a vector pattern of magnetization in the MRAM cell 1 according to the embodiment of FIG. 3.

FIGS. 4a to 4d illustrate the vector pattern of storage magnetization 231 of the storage layer 23 having the asymmetric shape of FIG. 3, during the write operation described above, according to an embodiment. More particularly, FIG. 4a shows the vector pattern of the storage magnetization 231 prior to applying the magnetic field 41. The asymmetrical shape of the storage layer 23 induces the C-state pattern in the storage magnetization 231. Applying the magnetic field 42 changes the C-state into the S-state pattern in the storage magnetization 231 (FIG. 4b). More particularly, the S-state pattern is induced by the second field component 420 being oriented substantially perpendicular to the anisotropy axis 60. The first field component 421, oriented substantially parallel to the anisotropy axis 60, causes the switching of the storage layer magnetization (FIG. 4c). FIG. 4d shows the vector pattern of the storage magnetization 231 being further re-stabilized in the C-state after the field current 41 is turned off and cooling the magnetic tunnel junction 2.

An advantage of the MRAM cell 1 having the asymmetrical shape is that the storage magnetization 231 is set in the S-state when the magnetic field 42 is applied. Since the magnetization in the S-state usually requires a relatively low external magnetic field to switch, the write operation can then be performed with a lower value of the field current 41 compared to writing the MRAM cell 1 with the storage layer 23 having the symmetrical shape. The MRAM cell 1 with the storage layer 23 having the asymmetrical shape has thus lower power consumption. The discussion above also applies to other asymmetrical shapes of the storage layer 23 as described above.

Figure 5:
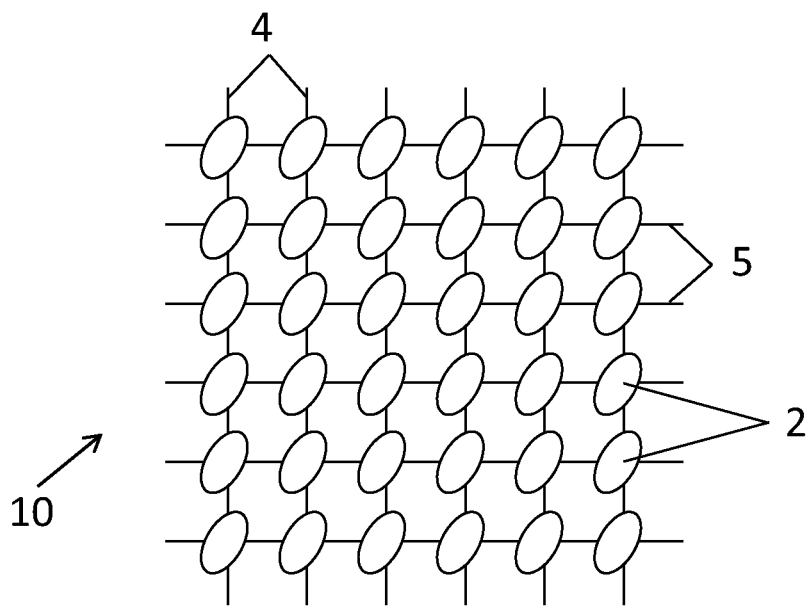
FIG. 5 illustrates a MRAM device comprising a plurality of the MRAM cell according to an embodiment.
Figure 6:
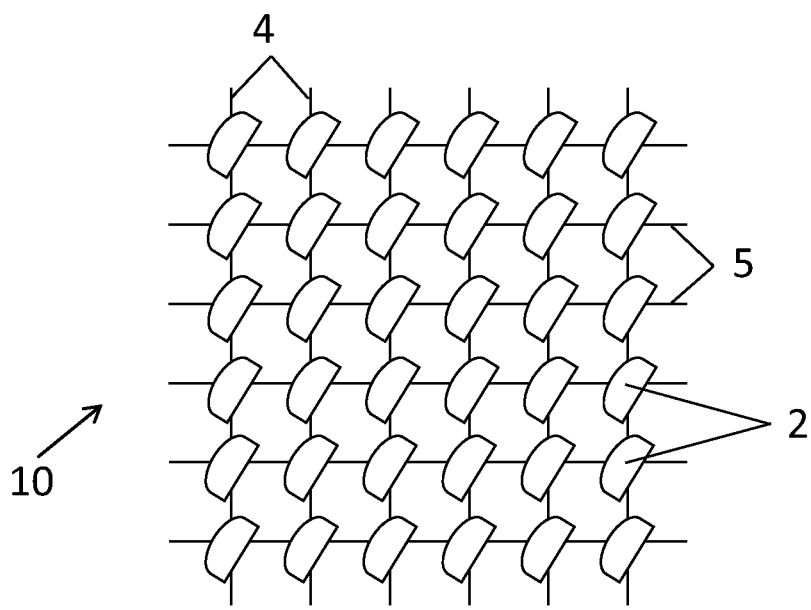
FIG. 6 illustrates a MRAM device comprising a plurality of the MRAM cell according to another embodiment.

FIG. 5 illustrates a MRAM device 10 comprising a plurality of the MRAM cell 1 arranged in rows and column, according to an embodiment. The device 10 further comprises a plurality of the first current line 4 extending along the first direction 70 and connecting MRAM cells along a row, and a plurality of the second current line 5, connecting MRAM cells 1 along a column. The second current line 5 can be connected to the MRAM cells 1 via their respective select transistor 3. Each MRAM cell 1 is arranged in an intersecting region of the first and second current lines 4, 5 such that the anisotropy axis 60 is oriented at the predetermined angle α with the current line 4. In the example of FIG. 5, the second ferromagnetic layer 23 of the MRAM cell 1 has a symmetric shape, more particularly, an elliptical shape. FIG. 6 illustrates the MRAM device 10 according to another embodiment, where the second ferromagnetic layer 23 of the MRAM cell 1 has the asymmetric shape as discussed above.

During the write operation, one of the MRAM cells 1 can be selectively written by passing the field current 41 in one of the first current lines 4 (activated first current line 4) and by passing the heating current 31 in one of the second current lines 5 (activated second current line 5). The MRAM cell 1 being at the intersection of the activated first and second current line 4, 5 can then be written (selected MRAM cell 1). In an embodiment, the heating current 31 is passed in the magnetic tunnel junction 2 of the selected MRAM cell 1 by setting the select transistor 3 in the passing mode. An advantage of the MRAM cells 1 where the second ferromagnetic layer 23 has the asymmetric shape is that write selectivity of the selected MRAM cell 1 is increased in comparison with the MRAM cells 1 where the second ferromagnetic layer 23 has the symmetric shape.

REFERENCE NUMBERS AND SYMBOLS 1 memory (MRAM) cell
10 MRAM device
2 magnetic tunnel junction
21 reference layer
22 tunnel barrier
23 storage layer
211 reference magnetization
231 storage magnetization
31 heating current
4 field line
41 field current
42 applied magnetic field
420 first field component
421 second field component
5 current line
60 easy axis of magnetization, anisotropy axis
61 hard axis of magnetization

70 first direction of first current line
α angle between the anisotropy axis and current line
β angle between the anisotropy axis and the applied magnetic field

The invention claimed is:

1. A magnetic random access memory (MRAM) cell comprising
   a tunnel magnetic junction comprising a first ferromagnetic layer, a second ferromagnetic layer having a second magnetization that can be oriented relative to an anisotropy axis of the second ferromagnetic layer at a predetermined high temperature threshold, and a tunnel barrier between the first and second ferromagnetic layer;
   a first current line extending along a first direction and in communication with the magnetic tunnel junction; the first current line being configured to provide an magnetic field for orienting the second magnetization when carrying a field current;
   the MRAM cell being configured with respect to the first current line such that when providing the magnetic field, at least a component of the magnetic field is substantially perpendicular to said anisotropy axis;
   the second ferromagnetic layer having an asymmetrical shape along at least one of its dimension such that the second magnetization comprises a C-state pattern, and
   said C-state pattern being changeable into a S-state pattern by the second field component and the second magnetization being switchable by the first field component, when the magnetic field is provided.

2. The MRAM cell according to claim 1, wherein the anisotropy axis is oriented at a predetermined angle with the direction of the current line.

3. The MRAM cell according to claim 2, wherein the predetermined angle is in a range comprised above 0° and below 90°.

4. The MRAM cell according to claim 2, wherein the predetermined angle is in a range comprised between 0° and 45°, and preferably being substantially 45°.

5. The MRAM cell according to claim 1, wherein the second ferromagnetic layer has an anisotropic shape and wherein the anisotropy axis is determined by the anisotropic shape of the second ferromagnetic layer.

6. The MRAM cell according to claim 1, wherein the second ferromagnetic layer comprises a magnetocrystalline anisotropy and wherein the anisotropy axis is determined by the magnetocrystalline anisotropy.

7. The MRAM cell according to claim 1, wherein said dimension comprises the anisotropy axis.

8. A MRAM device comprising a plurality of the MRAM cell according to claim 1, the MRAM cells being arranged in rows and columns;
   a plurality of the first current line extending along the first direction and connecting MRAM cells along a row; and
   a plurality of the second current line, connecting MRAM cells along a column.

9. A method for writing the MRAM cell according to claim 1, comprising:
   heating the magnetic tunnel junction;
   once the magnetic tunnel junction has reached the predetermined high temperature threshold, switching the second magnetization of the second ferromagnetic layer; and
   cooling the magnetic tunnel junction at a predetermined low temperature threshold for freezing the second magnetization in its written state; wherein
   said switching the second magnetization comprises passing the field current in the first current line for applying the magnetic field comprising at least a component substantially perpendicular to said anisotropy axis, and wherein
   said switching the second magnetization further comprises changing the C-state pattern of the second magnetization into a S-state pattern by the second field component.

10. The method according to claim 9, wherein the magnetic field further comprises a first field component that is oriented substantially parallel to the anisotropic axis, switching the second magnetization.

11. The method according to claim 9, wherein said passing the field current is performed prior said cooling the magnetic tunnel junction.

12. The method according to claim 9, further comprising turning off the field current and wherein said cooling the magnetic tunnel junction at a predetermined low temperature threshold is performed prior to turning off the field current.

* * * * *